United States Patent [19]

Crafts

[11] Patent Number: 5,497,027
[45] Date of Patent: Mar. 5, 1996

[54] MULTI-CHIP MODULE PACKAGING SYSTEM

[75] Inventor: Harold S. Crafts, Colorado Springs, Colo.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 159,898

[22] Filed: Nov. 30, 1993

[51] Int. Cl.$^6$ .................................................. H01L 23/02
[52] U.S. Cl. ..................... 257/528; 257/686; 257/693; 257/696; 257/777; 361/730; 361/732; 361/735; 361/746
[58] Field of Search ........................... 257/685, 686, 257/700, 690, 696, 693, 777, 758, 774, 211, 207, 528; 361/729, 730, 733, 731, 732, 735, 746

[56] References Cited

U.S. PATENT DOCUMENTS

| | | | |
|---|---|---|---|
| 4,482,938 | 11/1984 | Norden | 361/732 X |
| 4,652,974 | 3/1987 | Ryan | 361/395 |
| 4,688,864 | 8/1987 | Sorel | 361/730 X |
| 4,770,640 | 9/1988 | Walter | 361/735 X |
| 5,036,473 | 7/1991 | Butts et al. | 364/489 |
| 5,095,352 | 3/1992 | Noda et al. | 257/211 X |
| 5,343,075 | 8/1994 | Nishino | 257/686 |

FOREIGN PATENT DOCUMENTS 0405765  1/1991  European Pat. Off. ........ G01R 31/28

OTHER PUBLICATIONS

"Silicon Elevated Wireless Module Method for Making Engineering Changes;" IBM Technical Disclosure Bulletin; vol. 31, No. 10; Mar. 1989; pp. 71–74.

*Primary Examiner*—William Mintel
*Attorney, Agent, or Firm*—Wayne P. Bailey; Douglas S. Foote

[57] ABSTRACT

A three dimensional logic cube comprises a base plate having two vertically mounted backplanes attached thereto. A plurality of horizontally stacked substrates are coupled by connectors to the backplanes, with enough clearance between adjacent substrates to ensure heat dissipating air or fluid flow between the substrates. Typically, the substrates are multi-chip modules having a plurality of logic and interconnect chips attached at die mounting locations. Preferably, the logic and interconnect chips are attached to the substrate using flip TAB frames. The substrate includes a pattern interconnect for connecting together all of the chips. The logic chip is based on a standard 10K–50K gate array design with 100 micron pad spacing. The interconnect chip uses an interconnect pattern to connect the logic chips. The interconnect chip uses a lead placement identical to the logic chip, so that a single TAB frame can be used for both chips.

35 Claims, 5 Drawing Sheets

MULTI-CHIP MODULE PACKAGING SYSTEM

BACKGROUND OF THE INVENTION

1. Field of the Invention.

The present invention relates generally to packaging techniques for integrated circuits (ICs), and more specifically, to a method of using standard interconnect chips and Tape Automated Bonding (TAB) frames to implement mask-programmable interconnects for multi-chip module.

2. Description of Related Art

Packaging is considered by many in the industry to be the pacing technology for IC development. Advances in packaging have led to multi-chip modules for complex digital systems. Two of the principal problems facing developers of multi-chip modules are cost and development time.

There are a number of impediments which must be overcome before multi-chip modules will be used in volume by the commercial segment of the computer industry. One impediment is the increased development time required to design and fabricate a system based on multi-chip modules relative to the time required for an equivalent system based on PC boards. Another impediment is the high cost of substrates for multi-chip modules relative to the cost of an equivalent PC board. Still another impediment is the additional cost of TAB packaging for die mounted on the multi-chip modules.

Balancing these impediments to the use of modules, there are obvious problems with the use of PC boards in high performance systems. One problem is the longer time required to design and fabricate a PC board system having equivalent performance to a system based on multi-chip modules. Another problem is the high cost of the exotic materials required to construct a PC board system having the equivalent performance of a system based on multi-chip modules.

Taken altogether, the impediments to the use of modules are slowly being overcome through technology and infrastructure development, while the problems in utilizing PC boards are growing worse as system performance improves. In addition, there are some system level cost advantages for multi-chip modules that improve their long term economic outlook. One cost advantage is the lesser development time required to design and fabricate a PC board system having the equivalent performance of a system based on multi-chip modules. Another cost advantage is that the reduction in heat dissipation for a system based on multi-chip modules makes such a system more acceptable in an office environment where high performance systems add to the cooling load on the building's air conditioner. Still another cost advantage is the size reduction due to multi-chip modules, which reduces the cost of system level packaging. Yet another cost advantage is the inherent reliability of thermal compression interconnect bonds used in multi-chip modules, which reduces the system repair cost in the field.

While none of these considerations, in themselves, are serious impediments today to the use of systems based on PC boards, the next generation of electronics will have more functionality, larger die size, and require more heat dissipation, unless steps are taken in their design to reduce some of these factors. Although it is difficult to be precise without having actual design examples, it is not unreasonable to expect that multi-chip modules will achieve a factor of two to five increase in system speed and logical complexity without a corresponding increase in power levels.

Table I provides a summary of cost estimates for constructing a PC board system as compared to a system based on multi-chip modules. The PC board is estimated to be a 20 inch multi-layer board, while the module is 125 mm square. The PC board cost is estimated at $1.00 per square inch, while the multi-chip module cost is estimated at $3.20 per square centimeter. The increased cost of using TAB (due to its current low incidence of use) shows up in the increased cost of ICs in a system based on multi-chip modules. As can be seen from Table I, when all of these costs are taken into consideration, a system based on multi-chip modules is about equal in cost to a system using a PC board. If multi-chip modules can compete on the basis of total system cost, then the increased design cycle time becomes the principal impediment to their use in digital systems.

TABLE 1

| Component | Relative Cost | |
|---|---|---|
| | PC Board System | Module System |
| Substrates | $ 400.00 | $ 500.00 |
| Integrated Circuits | 1000.00 | 1200.00 |
| Other Components | 200.00 | 100.00 |
| Assembly & Test | 100.00 | 150.00 |
| Connectors | 200.00 | 150.00 |
| Backplanes | 100.00 | 25.00 |
| Power Supplies | 100.00 | 50.00 |
| System Packaging | 50.00 | 25.00 |
| Cost of Ownership (reliability) | 25.00 | 10.00 |
| Environmental Factors | 25.00 | 10.00 |
| TOTAL SYSTEM COST | $2200.00 | $2220.00 |

SUMMARY OF THE INVENTION

To overcome the limitations in the prior art described above, and to overcome other limitations that will become apparent upon reading and understanding the present specification, the present invention discloses a three dimensional logic cube comprising a base plate having two vertically mounted backplanes attached thereto. A plurality of horizontally stacked substrates are coupled by connectors to the backplanes, with enough clearance between adjacent substrates to ensure heat dissipating air or fluid flow between the substrates. Typically, the substrates are multi-chip modules having a plurality of logic and interconnect chips attached at die mounting locations. Preferably, the logic and interconnect chips are attached to the substrate using flip TAB frames. The substrate includes a pattern interconnect for connecting together all of the chips. The logic chip is based on a standard 10K–50K gate array design with 100 micron pad spacing. The interconnect chip uses an interconnect pattern to connect the logic chips. The interconnect chip uses a lead placement identical to the logic chip, so that a single TAB frame can be used for both chips.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

LOGIC CUBE

Figure 1A:
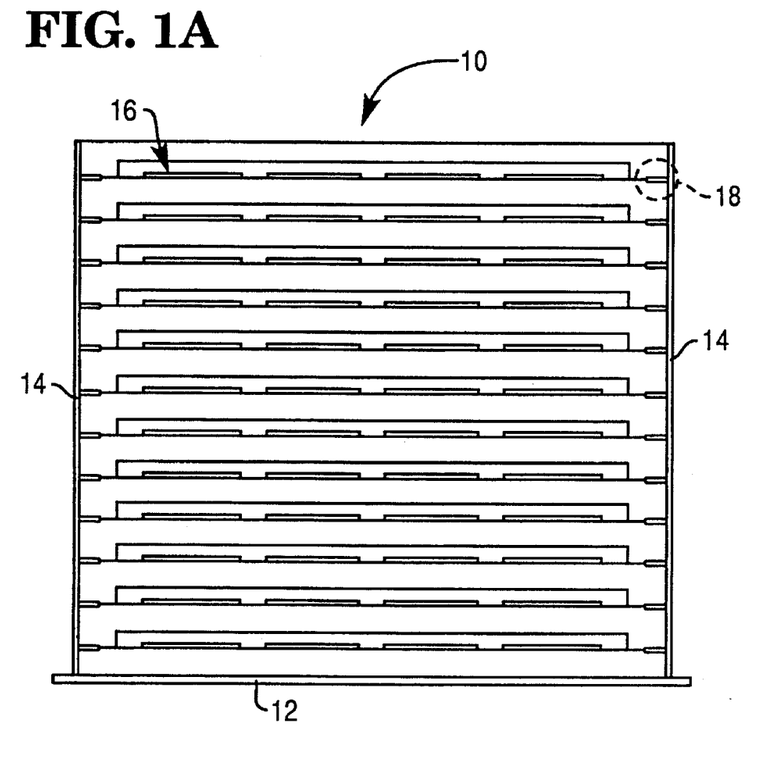
FIG. 1A is an illustration of a logic cube according to the present invention.

FIG. 1A is an illustration of a logic cube 10 according to the present invention. The logic cube 10 comprises a base plate 12 having two or more vertically mounted backplanes 14 attached thereto. A plurality of horizontally stacked substrates 16 are coupled by connectors 18 to the backplanes 14, with enough clearance between adjacent substrates 16 to ensure heat dissipating gas or fluid flow therebetween. The backplane 14 is a transmission line system providing a low noise signal environment between the substrates 16, and the system is designed in a top-down manner with the backplane 14 layout performed first to minimize crossovers. Signal integrity is maintained in the logic cube through the use of impedance-matched backplanes 14, substrates 16, and connectors 18.

In the example of FIG. 1A, twelve substrates 16 are stacked to create a logic cube 10 of approximately 125 millimeters on a side. The logic cube 10 can be combined with other similar logic cubes 10 to create a "hyper-cube" with an edge length of, for example, 250, 375, or 500 millimeters, depending upon the system requirements. Those skilled in the art will recognize that any number of substrates 16 may be stacked to create a logic cube 10 and that any number of logic cubes 10 can be combined to create a hyper-cube. Moreover, those skilled in the art will recognize that any combination of substrate 16 types can be stacked together in a logic cube 10.

Typically, the substrates 16 used in the logic cube 10 are multi-chip modules providing high density logic. However, components such as conventional ICs in plastic quad flat packs can be mounted on conventional PC boards or other specially fabricated substrates, so long as the substrates 16 conform to the dimensions of the logic cube 10. Moreover, double sided substrates 16 may be employed to improve density and reduce cost.

CONNECTORS

Figure 1B:
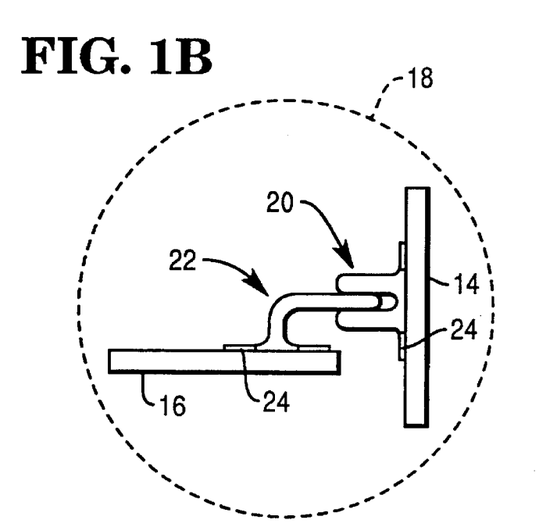
FIG. 1B is an exploded view of connector 18 in FIG. 1A, further illustrating the components of the connectors coupling the substrates to the backplanes.

FIG. 1B is an exploded view of a portion of FIG. 1A, further illustrating the components of the connectors 18 coupling the substrates 16 to the backplanes 14. The backplanes 14 may be coupled to the base plate 12 using similar connectors 18. Although the connectors 18 are preferably zero insertion force (ZIF), when closed they should provide high pressure contacts to enhance the reliability of the system. The connectors typically supply on the order of 800 connections to each 125 mm substrate 16 using only two edges of the substrate 16. The other two edges of the substrate 16 are available, if needed, for I/O cables or additional backplanes 14 or other connectors 18.

In the preferred embodiment, each connector 18 comprises a female clamp 20 having opposing clamping members and a male insertion member 22. The female clamp 20 is surface mounted on a top metal layer of the backplane 14, and the male insertion member 22 is surface mounted on a top metal layer of the substrate 16. Both the female clamp 20 and the male insertion member 22 are attached to their respective supporting structures using screws 24 or other means, so that mechanical stress is not absorbed by soldered connections. The mechanical tolerances of the connectors 18 should ensure that the substrates do not contribute to mechanical misalignment to any significant degree.

The female clamp 20 has a bi-metal strip which opens the opposing clamping members upon the application of a supply voltage to control inputs. Once the substrate 16 is in place, and the male insertion member 22 is inserted between the opposing clamping members, the supply voltage is removed from the control inputs and the female clamp 20 cools, thereby closing the opposing clamping members onto the male insertion member 22.

Since the connectors 18 are electrically actuated, they can be connected into a diagnostic self-test system which will release only those substrates 16 found to have failed in the system. This feature reduces unnecessary maintenance on otherwise good substrates 16 which would have been replaced on a trial and error basis.

It is possible to etch the connector 18 pattern directly into the substrate 16 to eliminate the use of a male insertion member 22. This requires that the connector 18 pattern be etched into both sides of the substrate 16 and the substrate 16 edge inserted into the female clamp 20. However, the cost of the male insertion member 22 typically is less than the additional cost of a two-sided substrate 16.

SUBSTRATES

Figure 2:
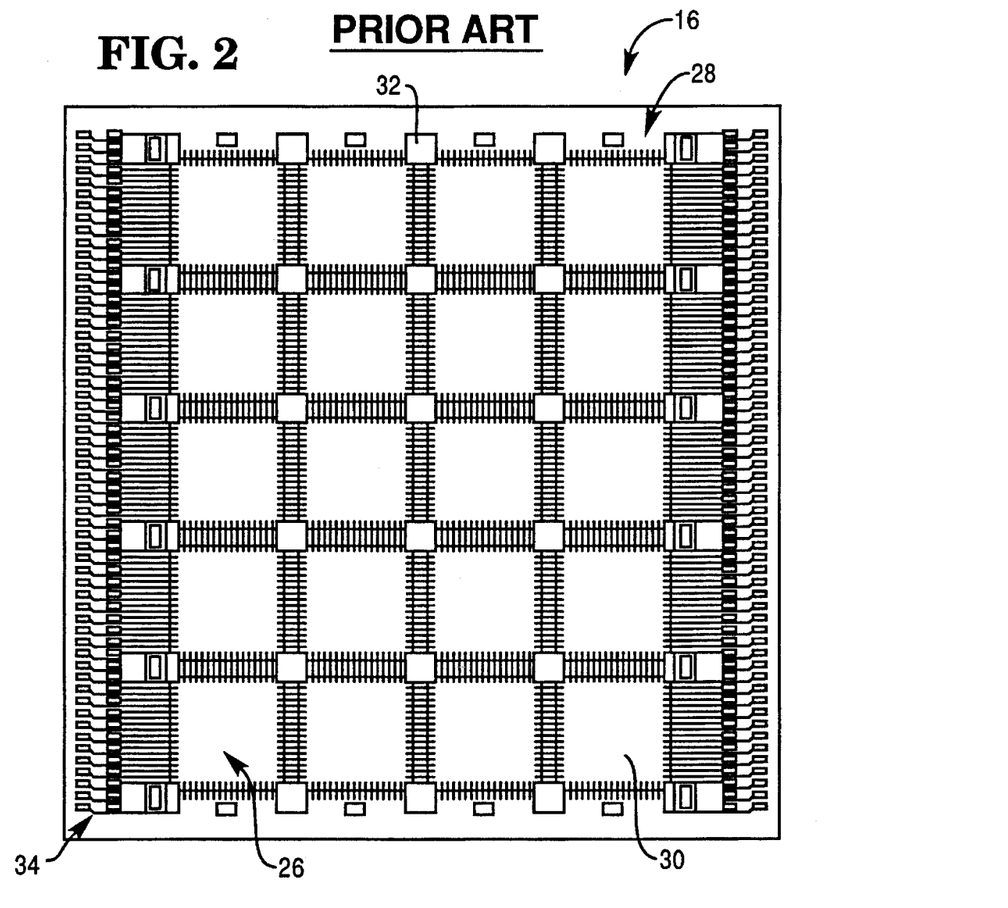
FIG. 2 illustrates a top view of a standard substrate for a multi-chip module.

FIG. 2 illustrates a top view of a standard substrate 16 for a multi-chip module. The substrate 16 is typically made of co-fired ceramic and contains a plurality of die mounting locations 26 indicated by the squares in FIG. 2 and a single layer of high resolution metal interconnect 28 programmed to connect adjacent chips together. The use of a ceramic substrate 16 provides a good thermal coefficient of expansion match with the silicon dice, thereby enhancing the reliability of the system. Alternatively, the substrate 16 could comprise some other materials, e.g., chopped aramid fibers, fiberglass, or other materials well known in the art.

The chip-to-chip interconnect pattern 28 is etched into a copper layer deposited on the surface of the ceramic substrate 16, and is approximately 50 microns wide on 100 micron centers. The interconnect pattern 28 preferably matches the outer leads of the TAB frames used to attach the chips to the substrate 16. A layer of polyimide 30 is added over the copper for scratch protection. Power and ground planes are deposited within the co-fired ceramic substrate 16 and are accessed by vias 32. An edge connector pattern 34 is also etched into a copper layer. Capacitors and resistors can be deposited in the substrate 16 to filter and terminate signals, respectively.

Figure 3:
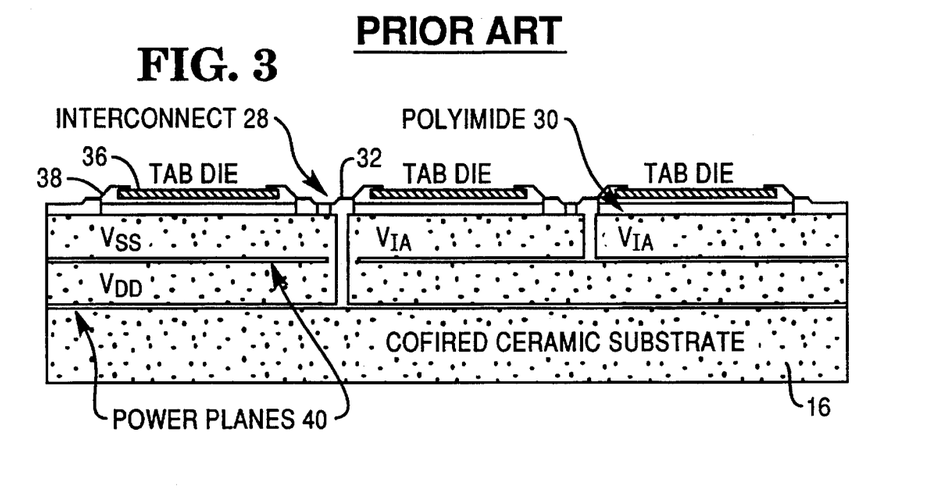
FIG. 3 is a cross-section of the substrate of FIG. 2, showing TABed die mounted on the substrate and electrically coupled to the interconnect pattern using TAB frames.

FIG. 3 is a cross-section of the substrate 16 of FIG. 2, showing chips 36 mounted on the substrate 16 and electrically coupled to the interconnect pattern 28 using TAB frames 38. The vias 32 access power and ground planes 40 deposited within the co-fired ceramic substrate 16. The chips 36 can be either interconnect chips or logic chips 36, or the interconnect and logic can be combined into a single chip 36. Regardless, most of the interconnect is contained on the chips 36 mounted on the substrate 16. In a typical case, approximately half of these chips 36 will implement interconnects rather than logic and are used primarily to connect one chip 36 to another across the substrate 16. These interconnects finally terminate at the edge connectors 34 on opposite sides of the substrate 16.

SUBSTRATE INTERCONNECT PATTERNS

The interconnect pattern on the substrate 16 can be produced with evaporated aluminum as is commonly used on ICs. However, aluminum interconnects typically have a very fine pitch, e.g., 1 micron lines, which results in high resistance and delayed signals. Generally, the interconnects should be much coarser, on the order of 25 microns in width, to keep the resistance low and thereby minimize signal delays.

Wider aluminum interconnects generally have enough current carrying capacity that they do not require buffering. However, wider aluminum interconnects often are too thin, e.g., only 1 micron thick. Thin aluminum lines result in a rather high capacity per unit length, which incurs extra delay and extra loading on the line drivers. On the other hand, attempts to make the dielectric layers thick, to cut down on the capacitance, often results in step coverage problems as well as stress problems in the dielectric.

Generally, these are considered scale factor problems because if the interconnect is scaled to cut down on its resistance, so that signals can be transmitted long distances, then the dielectric must also be scaled up to keep the capacitance low enough that the signals can be driven in the first place. These problems can be circumvented, however, if a copper/polyimide interconnect pattern is used for the substrate 16.

The copper is usually electroplated to a thickness of approximately 5 microns. The polyimide dielectric is often deposited in layers 5 to 10 microns thick and thus helps reduce the capacity of the interconnect lines. Further, polyimide is plastic and self-flattening, and thus helps avoid step coverage problems.

The advantages of an interconnect pattern fabricated using copper/polyimide is that it will reduce capacitive loading on the drivers and improve signal quality by maintaining a constant 50 ohm impedance. Further, the resistance and the capacitance of an interconnect pattern fabricated using copper/polyimide is 5 to 10 times lower than an interconnect pattern fabricated using aluminum. Using a copper/polyimide combination, the interconnects end up with the characteristics of transmission lines rather than resistive interconnects such as are found in ICs.

LOGIC CHIPS

The logic chips 36 employed in the present invention preferably comprise two basic types. One type of logic chip 36 is a standard gate array designed to fit the die mounting locations 26 on the substrate 16. The gate array is typically on the order of 10 millimeters square and may contain 25,000 to 50,000 gates. The gate array typically features close pad spacing, on the order of 100 microns, so that many leads can be used. Although most gate arrays are pad limited when fabricated with 1 micron resolution, the use of a TAB frame with identical 100 micron pad spacing allows more logic to be placed on the chip due to the increase in the number of leads over conventional wire bonded chips. Typically, there are approximately 100 pins on each edge of the gate array.

The other type of logic chip 36 is a standard IC that has been adapted to the die mounting locations 26 with a custom TAB frame 38. Standard ICs can be used for functions such as memory and microprocessors, where the density of standard devices offers significant cost and performance advantages over gate arrays. Standard ICs should be TABed in advance of the system design to avoid the delay associated with the design and fabrication of the tooling used in mounting the TABed device on the substrate 16. If the standard IC is too large to fit the die mounting location 26, a "pair" or a "quad" or more of these die mounting locations 26 can be used, although this is not very efficient.

Programmable logic in one or more of its various forms is another attractive alternative for use with the present invention. Programmable logic devices are becoming competitive with gate arrays for speed and cost, and offer a way to make corrections to system logic with little additional delay in the design cycle. Moreover, programmable logic devices can also add to the flexibility of the interconnect scheme used in the present invention.

Programmable array logic (PALs) devices can be used to implement rather simple logic which operates at high speed. Four small PALs could be packaged in TAB and mounted on a silicon substrate, which is, in turn, packaged in TAB 38 and attached to one or more of the die mounting locations 26 on the ceramic substrate 16. Alternatively, the PALs could be attached directly to a multi-chip TAB frame 38 and mounted as a unit on the ceramic substrate 16.

Field programmable gate arrays (FPGAs) can be used for more complex logic at somewhat reduced clock rates. FPGAs can be packaged in TAB and used to implement logic with a very short design cycle. FPGAs can also be used to make changes and repairs in systems that have been previously assembled from mask programmable circuits. FPGAs can even be used as programmable interconnects.

INTERCONNECT CHIPS

Figure 4A:
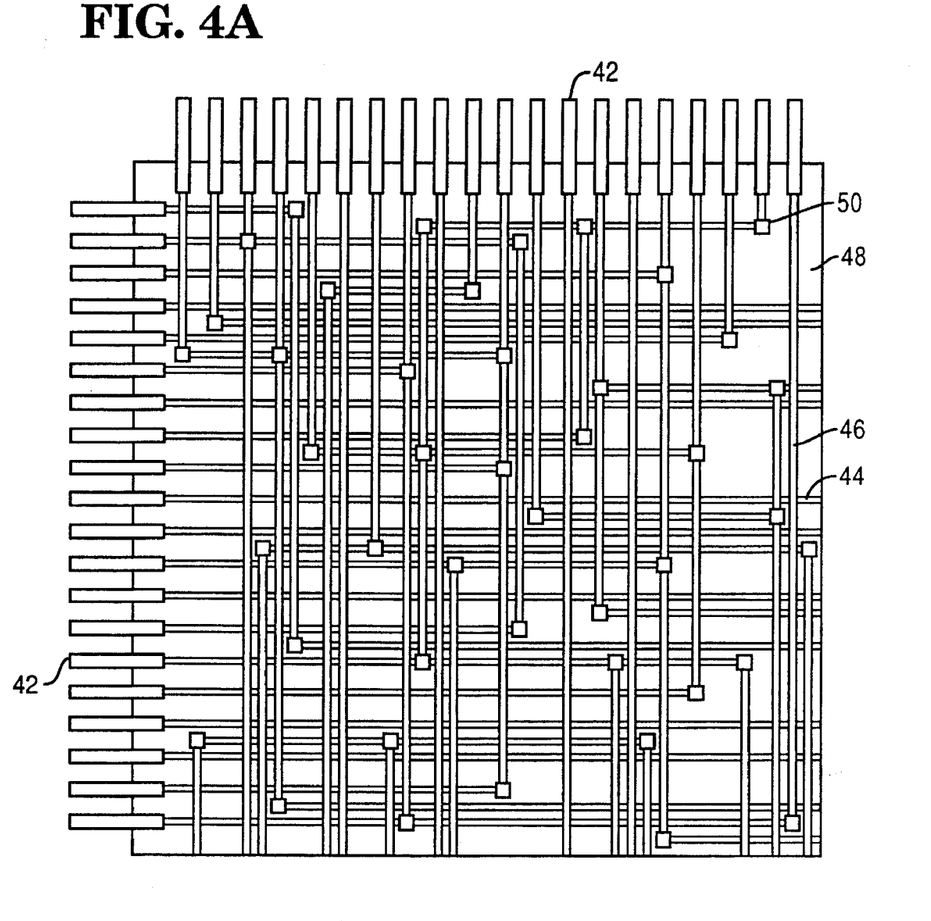
FIG. 4A illustrates a top view and FIG. 4B illustrates a cross-sectional view of a first example of an interconnect chip.
Figure 4B:
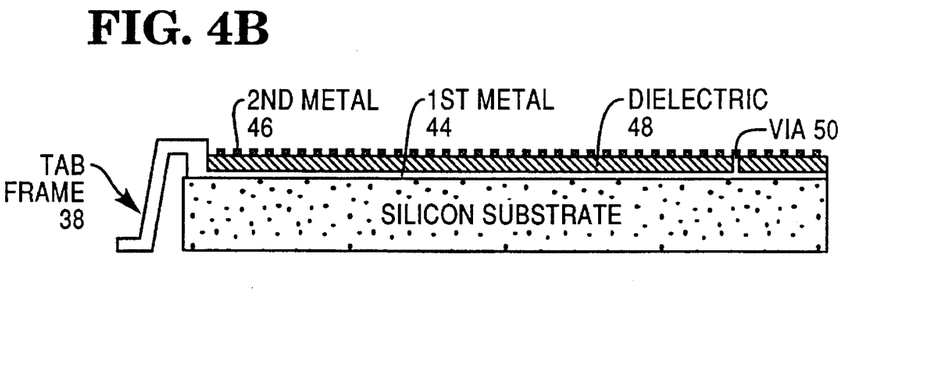

FIG. 4A illustrates a top view and FIG. 4B illustrates a cross-sectional view of a first example of an interconnect chip 36. Preferably, the interconnect chip 36 is the same size as the logic chip described above, and uses the same standard TAB frames 38 and tooling for packaging, thereby resulting in cost savings. Moreover, it is possible to place several interconnect or logic chips 36 on the same wafer for manufacturing, since all of the chips 36 are the same size.

The interconnect chip 36 is typically an IC with no active components that comprises only an interconnect pattern which ties together the pads 42 on the periphery of the chip 36. The interconnect chip 36 should be capable of connecting any two pads 42, so as to provide a connection therebetween and ultimately connecting together logic chips 36 on the substrate 16. Since the interconnect chips 36 typically contain no active components and the interconnect resolution is not very high, in order to keep the resistance and impedance low, the yield for interconnect chips 36 should approach 100%. Moreover, it is cheaper to produce interconnect patterns on a silicon substrate than it is to produce the same interconnect patterns on a ceramic substrate 16, primarily due to volume manufacturing. Further, the cost of the interconnect chips 36 will be dominated by their packaging cost. Thus, using the interconnect chip 36 reduces cost and lead time for a multi-chip module since standard TAB frames can be used.

Preferably, the interconnect pattern in the interconnect chip 36 comprises two orthogonal metal layers 44 and 46 separated by a dielectric layer 48, wherein each metal layer 44 and 46 is comprised of a plurality of parallel signal traces. Vias 50 are fabricated to connect signal traces in the two layers 44 and 46 through the dielectric 48. The interconnect pattern of FIGS. 4A and 4B is fabricated using two custom metal masks and a custom via mask. Ground planes may sandwich the two orthogonal metal layers 44 and 46 to keep the impedance of the interconnect pattern at 50 ohms. The use of ground planes above and below the interconnect pattern requires two additional metal masks and two to four additional via masks.

Figure 5A:
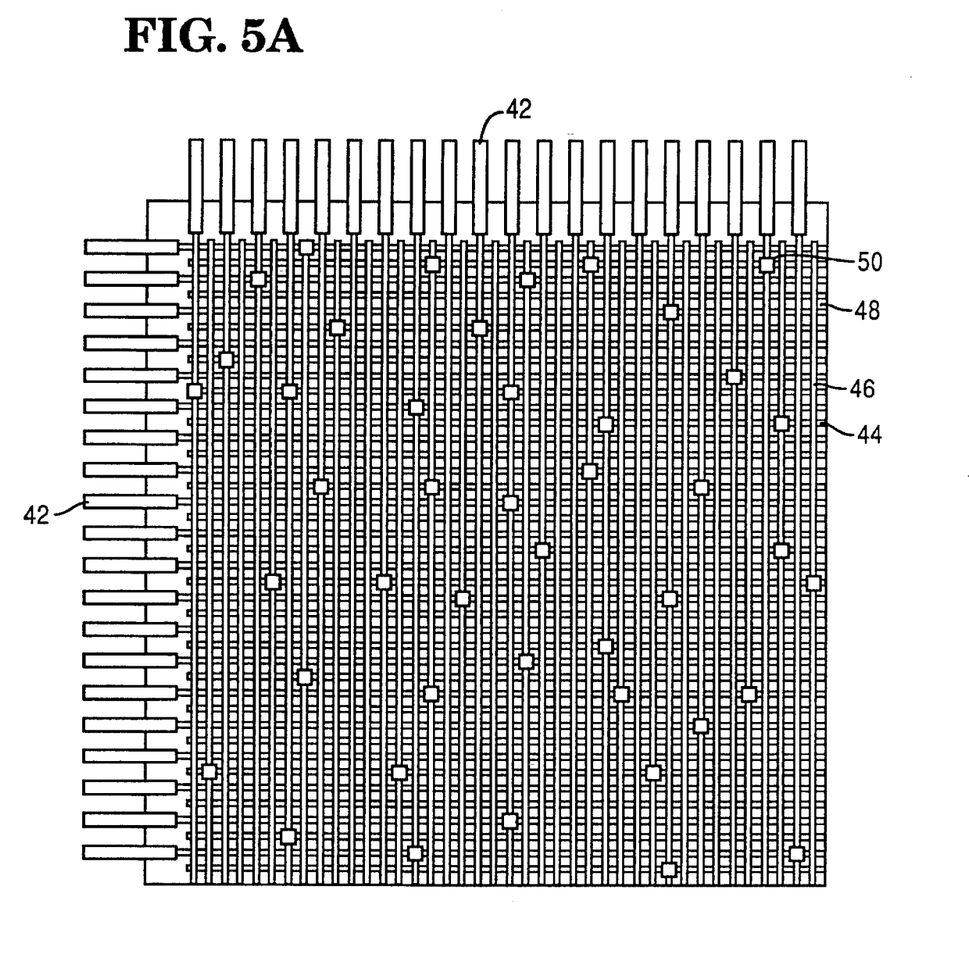
FIG. 5A illustrates a top view and FIG. 5B illustrates a cross-sectional view of a second example of an interconnect chip.
Figure 5B:
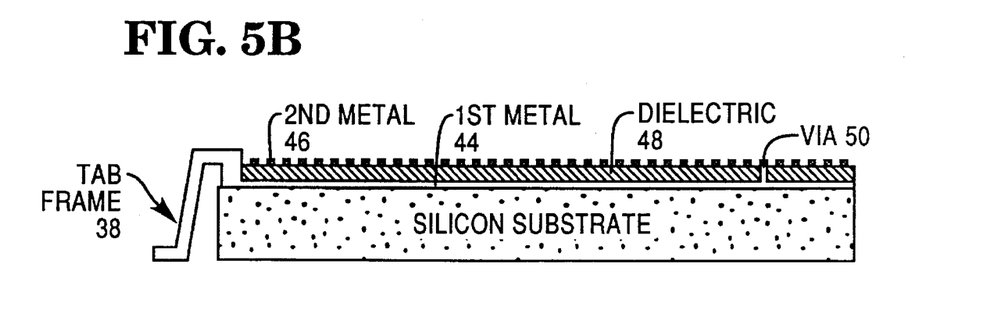

FIG. 5A illustrates a top view and FIG. 5B illustrates a cross-sectional view of a second example of an interconnect chip 36. Like FIGS. 4A and 4B, the interconnect pattern comprises two orthogonal metal layers 44 and 46 separated by a dielectric layer 48 with vias 50 interconnecting the layers 44 and 46 through the dielectric 48. The interconnect pattern of FIGS. 5A and 5B is fabricated using two standard metal masks and a custom via mask to effect cost savings over the "all custom" method illustrated in FIGS. 4A and 4B. However, this method would result in an interconnect pattern with numerous stubs where no connection is made between the orthogonal metal layers 44 and 46 of the interconnect pattern, which may cause signal quality problems or excess loading on the drivers. Those skilled in the art will recognize that other alternative embodiments comprising variations on these methods could also be used. For example, the bottom layer of metal and the top layer of metal which are used as ground planes may be fabricated using custom or standard masks. This is also true of the dielectric layers surrounding the interconnect patterns.

COMBINED LOGIC/INTERCONNECT CHIPS

A copper/polyimide interconnect pattern can be applied on top of the logic chip 36 as additional layers of the interconnect pattern, thereby creating a combined logic/interconnect chip. Since the yield of this interconnect pattern is very high, it should not materially affect the overall yield of the logic chip 36. Moreover, putting the copper/polyimide interconnect pattern on top of the logic chip 36 materially increases the logic density of the multi-chip module, since almost all of the chips 36 could be combined logic/interconnect chips 36. In addition, the logic can be connected to the lower level of the interconnect pattern on top of the chip 36 without occupying a pad 42 site.

TAB FRAMES

Figure 6:
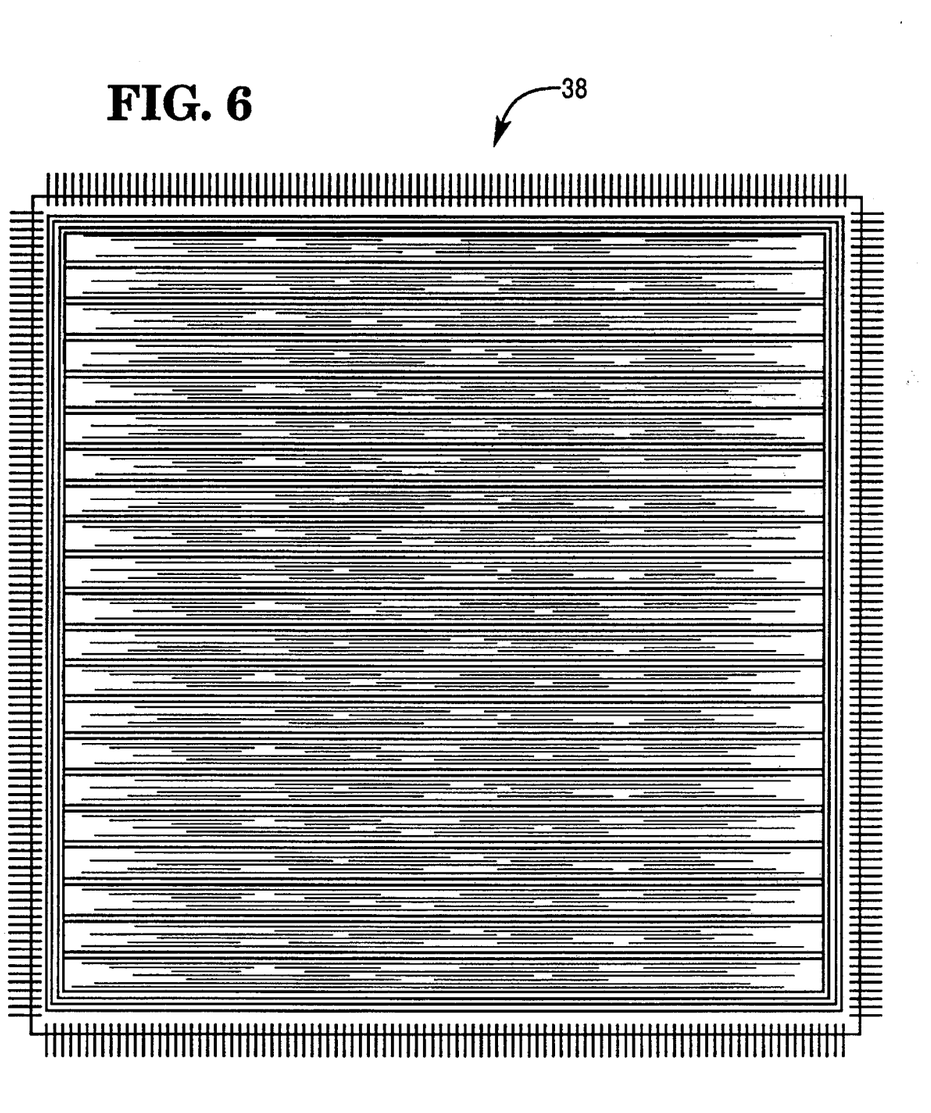
FIG. 6 is an illustration of a TAB frame connected to a gate array die.

FIG. 6 is an illustration of a TAB frame 38 used to attach a logic or interconnect chip 36 to the substrate 16, wherein the interior of the TAB frame 38 shows the interconnect pattern for the chip 36. Flip TAB is the preferred method of attaching chips 36 to the substrate 16 to keep the leads in the TAB frame 38 short, so that they do not affect signal quality.

The use of the TAB frame 38 can solve yield problems associated with the multi-chip module. For a multi-chip module to be successful, the yield for die 36 must be very high. However, the typical die 36 yield from semiconductor fabrication processes runs on the order of 90%. The primary reason for the 10% failure rate is that the die 36 are usually not adequately tested before packaging. If a single die 36 on a multi-chip module is defective, the module is too expensive to just throw away. Moreover, there are significant problems in identifying the bad die 36, as well as attempting to repair a multi-chip module that uses TAB packaging techniques. Thus, to successfully use multi-chip modules, it is important to have consistently good die 36.

The TAB frames 38 of the present invention can assist in the testing of the die 36 before it is installed on the multi-chip module. The TAB frames 38 can include test leads that fan out from the production in-line leads used with the multi-chip module. After testing, the test leads of the TAB frame 38 can be trimmed, so that only the production in-line leads remain on the TAB frame 38.

PARTITIONING AND ROUTING SYSTEM

To take advantage of the present invention, a computer-implemented logic partitioning and routing system is needed to partition the logic and route the interconnects. When separate logic and interconnect chips 36 are used, such a system must comprehend the nature of the substrate and make the required connections on the substrate 16 and interconnect chips 36 so that the logic is properly interconnected. When combined logic/interconnect chips 36 are used, such a system is required to partition the logic between the chips 36 and route the chips 36 together using the interconnect pattern of the substrate 16 and/or the interconnect pattern that is placed on top of the chips 36. Such a system performing the partitioning and routing must take into account the fact that corresponding so-called and logically separate (although physically identical) "logic" and "interconnect" chips 36 will be using the same set of pins.

CONCLUSION

This concludes the description of the preferred embodiment of the invention. The following paragraphs describe some advantages derived from the present invention.

The advantages of the present invention are numerous. The present invention satisfies an industry need for a multi-chip module that is cost competitive with standard PC boards. Moreover, the production costs of the present invention can be made more competitive with conventional methods, once the non-recurring engineering costs have been amortized. In addition, the increased performance achieved with the present invention more than offsets any additional costs.

What is claimed is:

1. A logic cube, comprising:

(a) a base plate;

(b) at least two backplanes mechanically mounted to the base plate;

(c) a plurality of substrates mechanically mounted between the backplanes and electrically coupled thereto, each substrate having voltage and ground vias, wherein the power planes and ground planes are sandwiched by dielectric and selectively connected to the vias;

(d) at least one logic chip mounted on each of the substrates;

(e) at least one interconnect chip mounted on each of the substrates; and (f) each substrate having a chip-to-chip interconnect pattern therein for electrically interconnecting the backplanes, the logic chips and the interconnect chips.

2. The logic cube of claim 1, further comprising a plurality of logic cubes combined together to create a hyper-cube.

3. The logic cube as set forth in claim 1, wherein the substrates comprise a plurality of substrate types.

4. The logic cube of claim 3, wherein the substrates comprise multi-chip modules.

5. The logic cube of claim 3, wherein the substrates comprise printed circuit boards.

6. The logic cube of claim 3, wherein the substrates comprise double sided substrates.

7. The logic cube of claim 3, further comprising connectors for coupling the substrates to the backplanes.

8. The logic cube of claim 3, further comprising connectors for coupling the backplanes to the base plate.

9. A logic cube, comprising:
(a) at least two backplanes; and
(b) a plurality of multi-chip modules mechanically mounted between the backplanes and electrically coupled thereto.

10. The logic cube of claim 9 above, further comprising:
(c) at least one logic chip mounted on each of the multi-chip modules;
(d) at least one interconnect chip mounted on each of the multi-chip modules;
(e) the multi-chip modules each having voltage and ground vias and power and ground planes, wherein the voltage and ground planes are sandwiched by dielectric and selectively connected to the vias; and
(e) the multi-chip modules each having a chip-to-chip interconnect pattern therein for electrically interconnecting the backplanes, the logic chips and the interconnect chips.

11. The logic cube of claim 9 above, further comprising a plurality of logic cubes combined together to create a hyper-cube.

12. The logic cube of claim 9 above, further comprising wherein the multi-chip modules comprise printed circuit boards.

13. The logic cube of claim 9 above, further comprising wherein the multi-chip modules comprise double sided substrates.

14. The logic cube of claim 9 above, further comprising connectors for coupling the multi-chip modules to the backplanes.

15. An integrated circuit packaging system, comprising:
(a) a substrate for a multi-chip module comprised of a plurality of die mounting locations and a first interconnect pattern programmed to connect together integrated circuits mounted in adjacent die mounting locations;
(b) at least one logic chip mounted on the substrate at one of the die mounting locations, wherein leads on the logic chip are electrically connected to the first interconnect pattern on the substrate; and
(c) at least one interconnect chip mounted on the substrate at one of the die mounting locations, wherein leads on the interconnect chip are electrically connected to the first interconnect pattern on the substrate, and the interconnect chip comprises a second interconnect pattern for connecting together any two pads on the interconnect chip, so that an electrical connection is provided between the two pads, thereby electrically connecting together logic chips, and wherein the interconnect chip comprises passive elements.

16. The integrated circuit of claim 15 above, wherein the first interconnect pattern is etched into a metal layer deposited on the surface of the substrate.

17. The integrated circuit of claim 15 above, wherein the first interconnect pattern matches outer lead bonds of TAB frames mounting the integrated circuits on the substrate.

18. The integrated circuit of claim 15 above, wherein the first interconnect pattern further comprises an edge connector pattern at the periphery of the substrate.

19. The integrated circuit of claim 15 above, wherein the substrate further comprises power and ground planes deposited therein and connected to the integrated circuits by vias.

20. The integrated circuit of claim 15 above, wherein the interconnect chip comprises a silicon substrate.

21. The integrated circuit of claim 15 above, wherein the second interconnect pattern comprises two orthogonal metal layers, and each metal layer is comprised of a plurality of parallel signal traces, and the second interconnect pattern further comprises at least one via for connecting together the signal traces in the two layers.

22. The integrated circuit of claim 15 above, further comprising ground planes sandwiching the two orthogonal metal layers to stabilize the second interconnect pattern's impedance.

23. An integrated circuit packaging system, comprising:
(a) a substrate for a multi-chip module comprised of a plurality of die mounting locations and an interconnect pattern that connects adjacent die mounting locations;
(b) first and second integrated circuit logic chips mounted on the substrate at first and second ones of the die mounting locations, respectively; and
(c) an interconnect chip mounted on the substrate at a location between the first and second ones of the die mounting locations, the interconnect chip having no active components and electrically connecting the first and second integrated circuit logic chips.

24. The integrated circuit of claim 23 above, wherein the interconnect pattern is etched into a metal layer deposited on the surface of the substrate.

25. The integrated circuit of claim 23 above, wherein the interconnect pattern matches outer lead bonds of TAB frames mounting the first and second integrated circuits on the substrate.

26. The integrated circuit of claim 25 above, wherein the interconnect pattern further comprises an edge connector pattern at the periphery of the substrate.

27. The integrated circuit of claim 23 above, wherein the substrate further comprises power and ground planes deposited therein and connected to the integrated circuits by vias.

28. The integrated circuit of claim 23 above, wherein the interconnect chip comprises a silicon substrate.

29. The integrated circuit of claim 23 above, wherein the interconnect chip comprises two orthogonal metal layers, each metal layer is comprised of a plurality of parallel signal traces, and at least one via for connecting together the signal traces in the two layers.

30. The integrated circuit of claim 29 above, further comprising ground planes sandwiching the two orthogonal metal layers to stabilize the interconnect pattern impedance.

31. A passive integrated circuit for electrically connecting together any two pad sites thereon, the integrated circuit being comprised of an interconnect pattern, the interconnect pattern being comprised of two orthogonal metal layers, wherein each metal layer is comprised of a plurality of parallel signal traces, and the interconnect pattern further being comprised of at least one via for connecting together the signal traces in the two layers.

32. The integrated circuit of claim 31 above, further comprising ground planes sandwiching the two orthogonal metal layers to stabilize the interconnect pattern impedance.

33. An integrated circuit that has no active components and that has interconnect lines for electrically connecting together any two pad sites thereon.

34. The integrated circuit of claim 33 above, wherein the integrated circuit is comprised of an interconnect pattern, the interconnect pattern being comprised of two orthogonal metal layers, each metal layer being comprised of a plurality of parallel signal traces, and the interconnect pattern further being comprised of at least one via for connecting together the signal traces in the two layers.

35. The integrated circuit of claim 34 above, further comprising ground planes sandwiching the two orthogonal metal layers to stabilize the interconnect pattern impedance.

* * * * *

UNITED STATES PATENT AND TRADEMARK OFFICE
CERTIFICATE OF CORRECTION

PATENT NO. : 5,497,027
DATED : Mar. 5, 1996
INVENTOR(S) : Harold S. Crafts

It is certified that error appears in the above-indentified patent and that said Letters Patent is hereby corrected as shown below:

Column 10, line 1, after "integrated circuit" insert --packaging system--.
Column 10, line 4, after "integrated circuit" insert --packaging system--.
Column 10, line 7, after "integrated circuit" insert --packaging system--.
Column 10, line 10, after "integrated circuit" insert --packaging system--.
Column 10, line 13, after "integrated circuit" insert --packaging system--.
Column 10, line 15, after "integrated circuit" insert --packaging system--.
Column 10, line 21, after "integrated circuit" insert --packaging system--.
Column 10, line 37, after "integrated circuit" insert --packaging system--.
Column 10, line 40, after "integrated circuit" insert --packaging system--.
Column 10, line 44, after "integrated circuit" insert --packaging system--.
Column 10, line 47, after "integrated circuit" insert --packaging system--.
Column 10, line 50, after "integrated circuit" insert --packaging system--.
Column 10, line 52, after "integrated circuit" insert --packaging system--.
Column 10, line 57, after "integrated circuit" insert --packaging system--.
Column 11, line 1, after "integrated circuit" insert --packaging system--.
Column 11, line 4, after "integrated circuit" insert --packaging system--.
Column 11, line 7, after "integrated circuit" insert --packaging system--.
Column 12, line 5, after "integrated circuit" insert --packaging system--.

Signed and Sealed this

Seventeenth Day of September, 1996

Attest:

BRUCE LEHMAN

*Attesting Officer*  *Commissioner of Patents and Trademarks*